(12) United States Patent
Yoon (10) Patent No.: US 9,747,113 B2
(45) Date of Patent: Aug. 29, 2017

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Hyun-Su Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 14/643,497

(22) Filed: Mar. 10, 2015

(65) Prior Publication Data

US 2016/0098280 A1 Apr. 7, 2016

(30) Foreign Application Priority Data

Oct. 7, 2014 (KR) ............... 10-2014-0135064

(51) Int. Cl.
*G06F 9/44* (2006.01)
*G11C 17/16* (2006.01)
*G11C 17/18* (2006.01)

(52) U.S. Cl.
CPC ............ *G06F 9/4401* (2013.01); *G11C 17/16* (2013.01); *G11C 17/18* (2013.01)

(58) Field of Classification Search
CPC ........ G06F 9/4401; G11C 17/16; G11C 17/18
See application file for complete search history.

(56) References Cited

U.S. PATENT DOCUMENTS 9,202,556 B1 * 12/2015 Kim ................. G11C 17/18

FOREIGN PATENT DOCUMENTS

KR 1020060075832 7/2006

* cited by examiner

*Primary Examiner* — Abdelmoniem Elamin
(74) *Attorney, Agent, or Firm* — IP & T Group LLP (57) ABSTRACT

A semiconductor device includes a boot-up signal generator suitable for generating a boot-up signal based on an external reset signal and a specific mode signal; and an internal circuit suitable for performing a boot-up operation based on the boot-up signal.

17 Claims, 9 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2014-0135064, filed on Oct. 7, 2014, which is incorporated herein by reference in its entirety.

BACKGROUND

1. Field

Various embodiments of the present invention relate to a semiconductor design technology and, more particularly, to a semiconductor device and a semiconductor system including the semiconductor device.

2. Description of the Related Art

As technology in the semiconductor field has advanced, a plurality of semiconductor devices have been integrated in one chip to form a semiconductor system. Each of the semiconductor devices includes a plurality of logic circuits. In general, the logic circuits need to be initialized for the semiconductor device to stably operate. The logic circuits are initialized when the semiconductor device performs an initial operation, and the logic circuits are initialized whenever the semiconductor device needs to be initialized during a normal operation.

Each of the semiconductor devices includes a one-time programmable (OTP) circuit for storing information, such as repair data. Typically, an OTP circuit includes a fuse circuit and a latch circuit, and requires a boot-up operation. The boot-up operation includes a process of reading OTP data that is stored in the fuse circuit and latching the read OTP data in the latch circuit. The boot-up operation is performed just once while the initial operation of the semiconductor device is performed.

Figure 1:
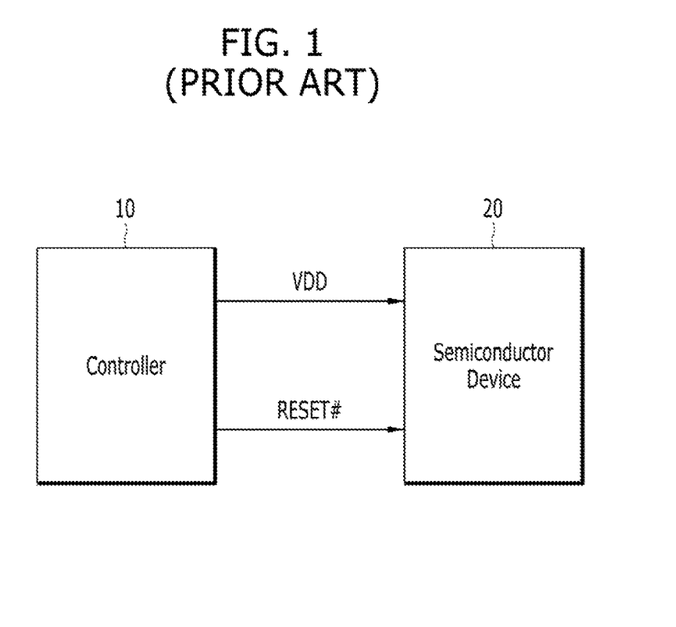
FIG. 1 is a block diagram illustrating a conventional semiconductor system.

FIG. 1 is a block diagram illustrating a conventional semiconductor system.

Referring to FIG. 1, the conventional semiconductor system includes a controller 10 and a semiconductor device 20. The controller 10 generates a power source voltage VDD and a reset control signal RESET#. The semiconductor device 20 performs reset operation based on the power source voltage VDD and the reset control signal RESET#.

Furthermore, the controller 10 controls the general operation of the semiconductor device 20. For example, the controller 10 includes a memory controller, a central processing unit (CPU) or a graphic processing unit (GPU).

The semiconductor device 20 performs the reset operation and other predetermined operations under the control of the controller 10. For example, the semiconductor device 20 includes a memory device such as a dynamic random access memory (DRAM).

Figure 2:
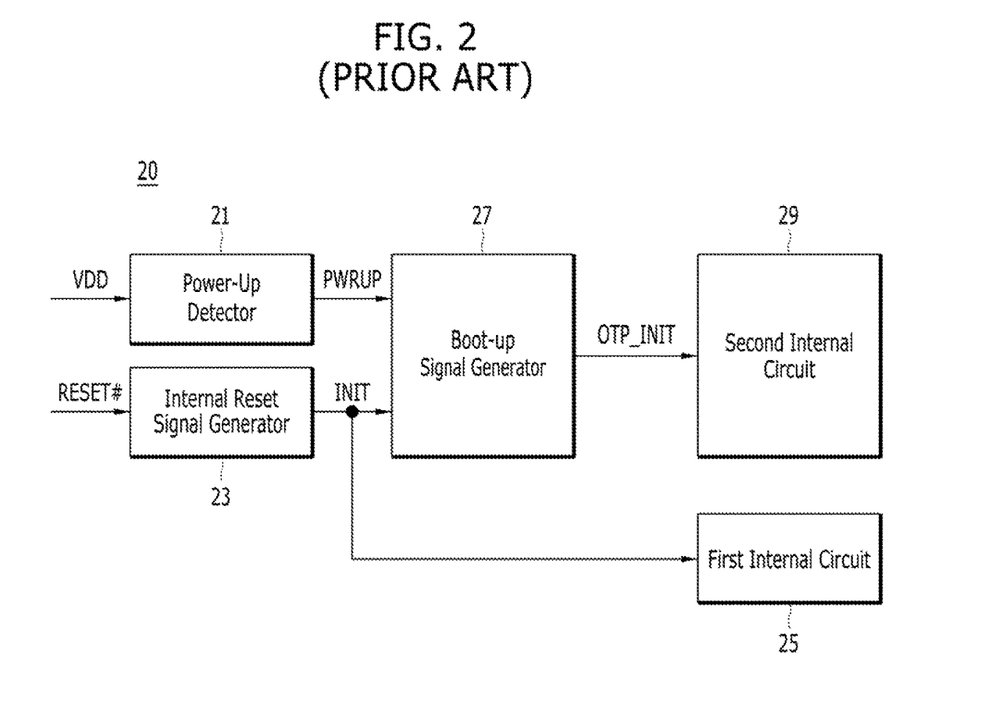
FIG. 2 is a detailed diagram of a semiconductor device shown in FIG. 1.

FIG. 2 is a detailed diagram of the semiconductor device 20 shown in FIG. 1. FIG. 2 shows only the structure related to the reset operation.

Referring to FIG. 2, the semiconductor device 20 includes a power-up detector 21, an internal reset signal generator 23, a first internal circuit 25, a boot-up signal generator 27, and a second internal circuit 29. The power-up detector 21 generates a power-up signal PWRUP corresponding to a power-up section of the power source voltage VDD. The internal reset signal generator 23 generates an internal reset signal INIT based on the reset control signal RESET#. The first internal circuit 25 performs a reset operation based on the internal reset signal INIT. The boot-up signal generator 27 generates a boot-up signal OTP_INIT. The second internal circuit 29 performs the boot-up operation based on the boot-up signal OTP_INIT.

The power-up detector 21 detects a power-up section of the power source voltage VDD and generates the power-up signal PWRUP corresponding to the detection result. The power-up detector 21 may include a voltage distribution circuit.

The internal reset signal generator 23 generates the internal reset signal INIT by buffering the reset control signal RESET#. The internal reset signal generator 23 may include a buffer circuit.

The first internal circuit 25 performs the reset operation whenever the internal reset signal INIT is activated. The first internal circuit 25 may include a logic circuit, such as a counter circuit, and the reset operation may include a process of initializing a logic value such as a count value.

The boot-up signal generator 27 generates the boot-up signal OTP_INIT during the initial operation section, corresponding to the power-up signal PWRUP, based on the internal reset signal INIT. In other words, the boot-up signal generator 27 activates the boot-up signal OTP_INIT based on the internal reset signal INIT only in the initial operation section, and deactivates the boot-up signal OTP_INIT in the normal operation section other than the initial operation section, regardless of the internal reset signal INIT.

The second internal circuit 29 performs the boot-up operation when the boot-up signal OTP_INIT is activated. The second internal circuit 29 may include the OTP circuit. Herein, the boot-up operation includes a process of reading and latching OTP data that is programmed in the OTP circuit.

Hereafter, an operation of the general semiconductor system having the above-described structure is described with reference to FIG. 3.

Figure 3:
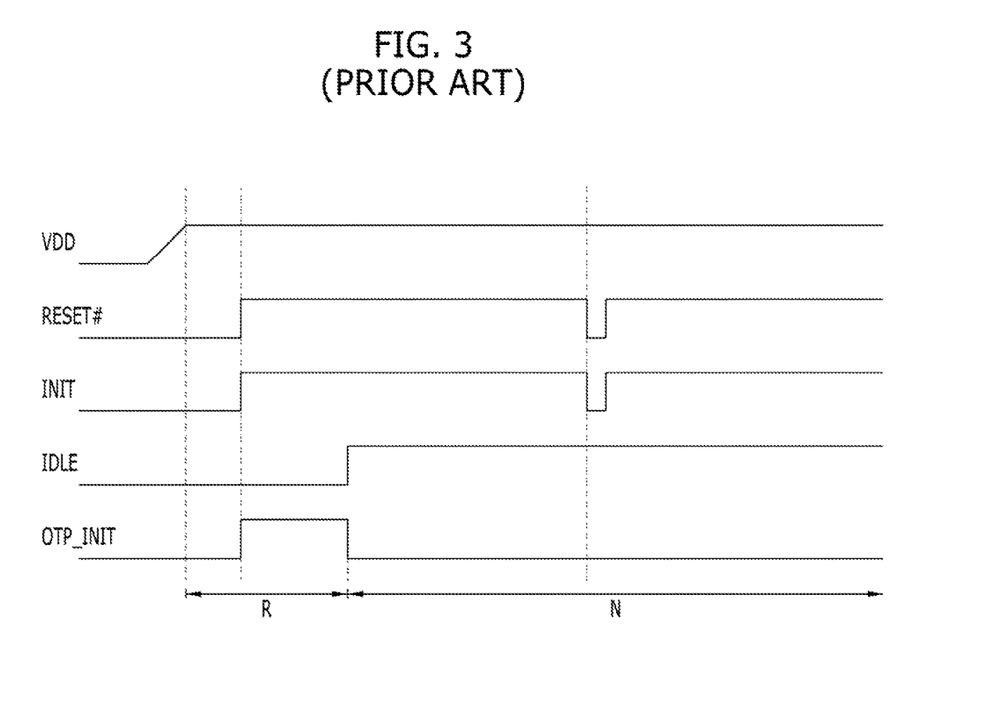
FIG. 3 is a timing diagram for describing an operation of the conventional semiconductor system shown in FIG. 1.

FIG. 3 is a timing diagram for describing an operation of the conventional semiconductor system shown in FIG. 1.

Referring to FIGS. 1 to 3, the controller 10 supplies the power source voltage VDD to the semiconductor device 20. The controller 10 activates the reset control signal RESET# to a logic low level from a moment when it supplies the power source voltage VDD to a portion of the initial operation section R and in a normal operation section N, the controller 10 activates the reset control signal RESET# to a logic low level whenever the controller 10 requires the semiconductor device 20 to be initialized. Particularly, for a boot-up operation, the controller 10 activates the reset control signal RESET# to a logic low level of over approximately 200 μs in the initial operation section R, and then deactivates the reset control signal RESET# to a logic high level.

The semiconductor device 20 performs reset operation based on the power source voltage VDD and the reset control signal RESET#.

First, the internal reset signal generator 23 generates the internal reset signal INIT by buffering the reset control signal RESET#. The first internal circuit 25 then performs the reset operation in the initial operation section R based on the activated internal reset signal INIT.

To be specific, the reset operation includes a process of initializing an output logic value of the first internal circuit 25 into a predetermined default value. The first internal circuit 25 performs the reset operation even in the normal operation section N, based on the internal reset signal INIT, whenever the reset operation needs to be performed.

The boot-up signal generator 27 generates the boot-up signal OTP_INIT that is activated in the initial operation section R based on the power-up signal PWRUP and the internal reset signal INIT. The second internal circuit 29 then performs the boot-up operation in the initial operation section R based on the activated boot-up signal OTP_INIT. The boot-up operation may include a process of reading and latching the OTP data that is programmed in the second internal circuit 29. For reference, 'IDLE' denotes an idle section signal that corresponds to the initial operation section R.

SUMMARY

Various embodiments of the present invention are directed to a semiconductor device that may perform a boot-up operation of a one-time programmable (OTP) circuit even in a normal operation section, and a semiconductor system including the semiconductor device.

Various embodiments of the present invention are directed to a semiconductor device that may perform a boot-up operation of an OTP circuit while an internal voltage, used in the OTP circuit, is stabilized and a semiconductor system including the semiconductor device.

Various embodiments of the present invention are directed to a semiconductor device that may monitor the result of a boot-up operation of an OTP circuit, while a boot-up operation of the OTP circuit is performed, and a semiconductor system including the semiconductor device.

In accordance with an embodiment of the present invention, a semiconductor device may include: a boot-up signal generator suitable for generating a boot-up signal based on an external reset signal and a specific mode signal; and an internal circuit suitable for performing a boot-up operation based on the boot-up signal.

The boot-up signal generator may generate the boot-up signal based on the external reset signal during a first operation section, and generate the internal reset signal based on the external reset signal and the specific mode signal during a second operation section, exclusive of the first operation section.

The first operation section may include an initial operation section corresponding to a power-up section, and the second operation section may include a normal operation section subsequent to the initial operation section.

The specific mode signal may include a signal corresponding to a soft post package repair (sPPR) mode.

The internal circuit may include a one-time programmable (OTP) circuit.

The boot-up operation in the sPPR mode may include an operation of reading and latching data for replacing one-time programmable (OTP) data that is programmed in the OTP circuit.

In accordance with an embodiment of the present invention, a semiconductor device may include: a power-up detector suitable for detecting a power-up section of an external power source voltage to generate a power-up signal; a mode signal generator suitable for generating a specific mode signal based on an external mode related signal; an internal reset signal generator suitable for generating an internal reset signal based on an external reset signal; a boot-up signal generator suitable for generating a boot-up signal based on the internal reset signal boot-up signal generator; and an internal circuit suitable for performing a boot-up operation based on the boot-up signal.

The boot-up signal generator may generate the boot-up signal based on the internal reset signal during an initial operation section, and generate the boot-up signal based on the internal reset signal and the specific mode signal during a normal operation section that is subsequent to the initial operation section.

The boot-up signal generator may include: a section control unit suitable for generating a first section signal corresponding to the initial operation section, and generating a second section signal activated in the normal operation section based on the specific mode signal; and a boot-up control unit suitable for activating the boot-up signal based on the first section signal and the internal reset signal during the initial operation section, and activating the boot-up signal based on the internal reset signal, the second section signal, and the specific mode signal, during the normal operation section.

The boot-up control unit may include: a first circuit suitable for generating a boot-up starting signal and a boot-up ending signal that are sequentially activated with a predetermined time gap therebetween based on the first and boot-up signals and the first and second section signals; and a second circuit suitable for generating the boot-up signal that is activated based on the boot-up starting signal and deactivated based on the boot-up ending signal.

The first circuit may include: a first initiating pulse generation block suitable for generating a first initiating pulse signal at a moment when the internal reset signal is deactivated; a second initiating pulse generation block suitable for generating a second initiating pulse signal by delaying the first initiating pulse signal by a predetermined time; a boot-up initiating block suitable for outputting the first initiating pulse signal as the boot-up starting signal based on the first section signal and outputting the second initiating pulse signal as the boot-up starting signal based on the second section signal; and a boot-up ending block suitable for generating the boot-up ending signal at a moment when the boot-up signal is deactivated.

The boot-up control unit may activate the boot-up signal after an internal voltage that is used for the reset operation is stabilized.

The semiconductor device may further include: an internal voltage generation circuit that is activated ahead of a moment when the boot-up signal is activated based on the power-up signal, the first initiating pulse signal, and the second section signal, and deactivated based on the boot-up ending signal.

The second circuit may include an SR latch circuit.

The mode signal generator may include a mode register set (MRS).

The specific mode signal may include a signal corresponding to a soft post package repair (sPPR) mode.

The internal circuit may include a one-time programmable (OTP) circuit, and the boot-up operation in the sPPR mode includes an operation of reading and latching data for replacing OTP data that is programmed in the OTP circuit.

In accordance with an embodiment of the present invention, a semiconductor system may include: a semiconductor device suitable for performing a boot-up operation based on a reset control signal during an initial operation section corresponding to a power-up section of a power source voltage, and performing the boot-up operation based on a mode related signal during a normal operation section that is subsequent to the initial operation section; and a controller suitable for providing the semiconductor device with the power source voltage, the reset control signal and the mode related signal.

The semiconductor device may generate a specific information signal corresponding to the boot-up operation, and the controller may monitor the specific information signal.

The mode related signal may include a signal corresponding to a soft post package repair (sPPR) mode.

The semiconductor device may include: a power-up detector suitable for detecting a power-up section of the power source voltage to generate a power-up signal; a mode signal generator suitable for generating a specific mode signal based on the mode related signal; an internal reset signal generator suitable for generating an internal reset signal based on an external reset signal; a boot-up signal generator suitable for generating a boot-up signal based on the internal reset signal and the specific mode signal; an internal circuit suitable for reading predetermined fuse data and latching the read fuse data based on the boot-up signal signal; and a monitoring circuit suitable for transmitting the fuse data that is latched in the internal circuit as the specific information signal to the controller based on the boot-up signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

Figure 4:
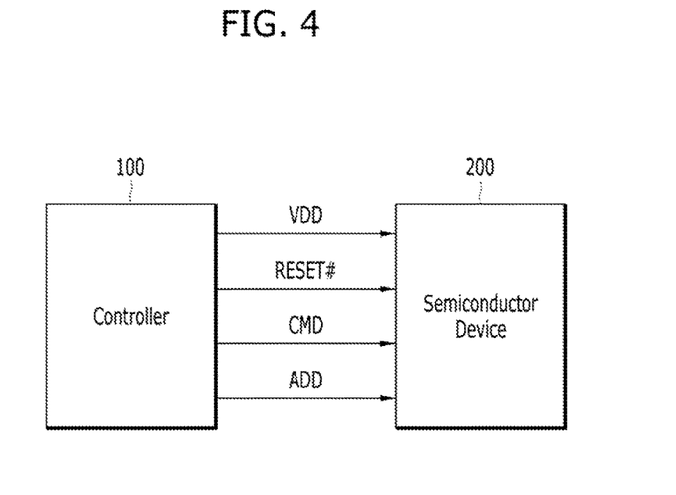
FIG. 4 is a block diagram illustrating a semiconductor system in accordance with an embodiment of the present invention.

FIG. 4 is a block diagram illustrating a semiconductor system in accordance with an embodiment of the present invention.

Referring to FIG. 4, the semiconductor system may include a controller 100 and a semiconductor device 200. The controller 100 generates a power source voltage VDD, a reset control signal RESET#, and mode related signals, in which a command signal CMD and an address signal ADD may be included. The semiconductor device 200 performs a reset operation and a boot-up operation based on the power source voltage VDD, the reset control signal RESET#, and the mode related signals CMD and ADD.

The controller 100 controls the general operation of the semiconductor device 200. For example, the controller 100 includes a memory controller, a central processing unit (CPU) or a graphic processing unit (GPU).

The semiconductor device 200 performs the reset operation, the boot-up operation, and predetermined operations under the control of the controller 100. For example, the semiconductor device 200 includes a memory device, such as a DRAM.

Figure 5:
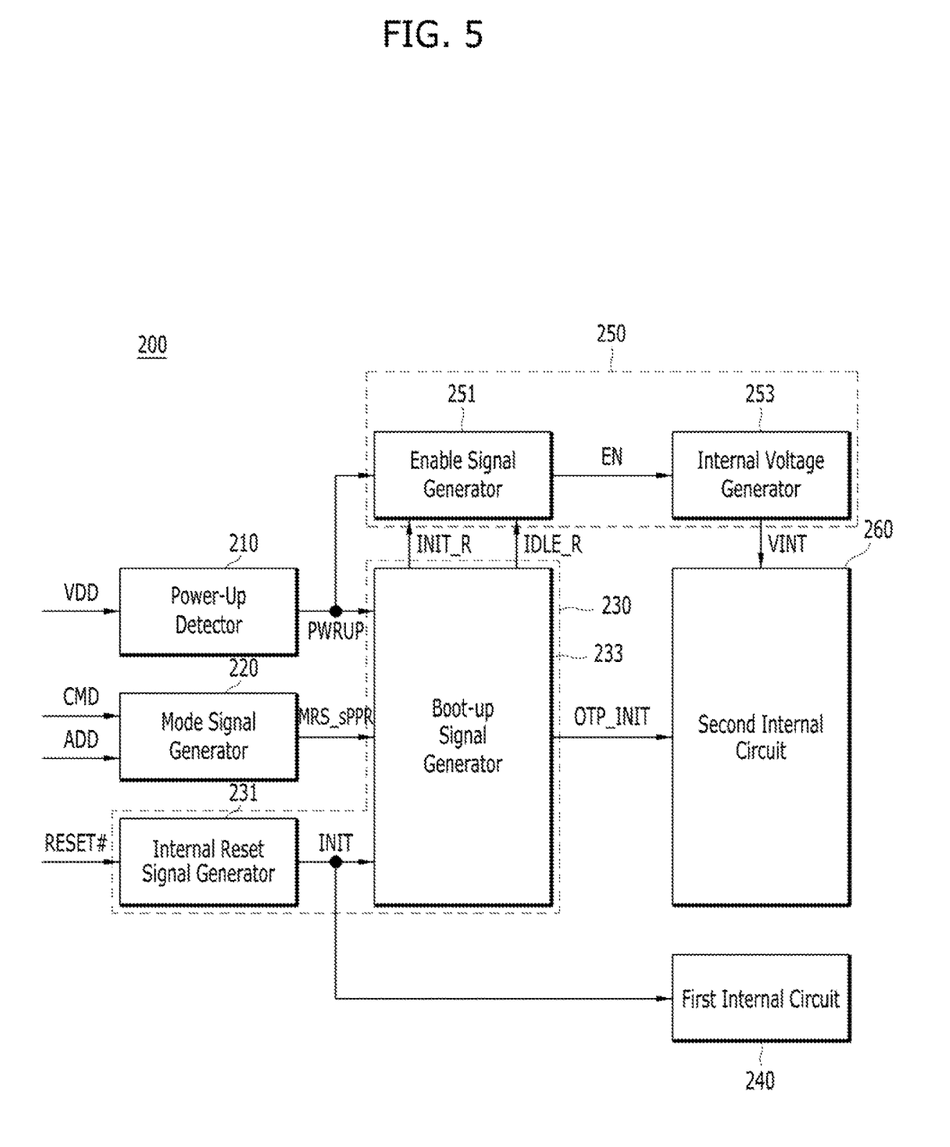
FIG. 5 is a detailed diagram of a semiconductor device shown in FIG. 4.

FIG. 5 is a detailed diagram of the semiconductor device 200 shown in FIG. 4. FIG. 5 shows only the structure related to the reset operation and the boot-up operation.

Referring to FIG. 5, the semiconductor device 200 may include a power-up detector 210, a mode signal generator 220, a reset control circuit 230, a first internal circuit 240, an internal voltage generation circuit 250, and a second internal circuit 260. The power-up detector 210 generates a power-up signal PWRUP corresponding to a power-up section of the power source voltage VDD. The mode signal generator 220 generates a specific mode signal MRS_sPPR based on the mode related signals. The reset control circuit 230 generates an internal reset signal INIT and a boot-up signal OTP_INIT based on the reset control signal RESET# and the specific mode signal MRS_sPPR. The first internal circuit 240 performs the reset operation based on the internal reset signal INIT. The internal voltage generation circuit 250 generates an internal voltage VINT based on a first initiating pulse signal INIT_R and a second section signal IDLE_R that are outputted from the reset control circuit 230. The second internal circuit 260 performs the boot-up operation based on the internal voltage VINT in response to the boot-up signal OTP_INIT.

The power-up detector 210 may detect a power-up section of the power source voltage VDD and generate the power-up signal PWRUP corresponding to the detection result. The power-up detector 210 may include a voltage distribution circuit.

The mode signal generator 220 may generate the specific mode signal MRS_sPPR that is activated according to a specific mode based on the mode related signals. The mode signal generator 220 may include a mode register set (MRS), and the specific mode may include a soft post package repair (sPPR) mode. The mode related signals may include a command signal CMD and an address signal ADD that are outputted from the controller 100.

The reset control circuit 230 may include an internal reset signal generator 231 and a boot-up signal generator 233. The internal reset signal generator 231 generates the internal reset signal INIT based on the reset control signal RESET#. The boot-up signal generator 233 generates the boot-up signal CTP_INIT based on one between the internal reset signal INIT and the specific mode signal MRS_sPPR for each operation section. The internal reset signal generator 231 may include a buffer circuit that generates the internal reset signal INIT by buffering the reset control signal RESET#. The boot-up signal generator 233 may activate the boot-up signal OTP_INIT based on the internal reset signal INIT during an initial operation section corresponding to the power-up section, and activate the boot-up signal OTP_INIT based on the specific mode signal MRS_sPPR during a normal operation section other than the initial operation section.

The first internal circuit 240 performs the reset operation whenever the internal reset signal INIT is activated. The first internal circuit 240 may include a logic circuit, such as a counter circuit, and the reset operation may include a process of initializing a logic value, such as a count value.

The internal voltage generation circuit 250 may include an enable signal generator 251 and an internal voltage generator 253. The enable signal generator 251 generates an enable signal EN based on the power-up signal PWRUP, the first initiating pulse signal INIT_R, and the second section signal IDLE_R. The internal voltage generator 253 generates the internal voltage VINT based on the enable signal EN. The enable signal generator 251 may activate the enable signal EN during the initial operation section based on the power-up signal PWRUP, and activate the enable signal EN during a portion of the normal operation section based on the first initiating pulse signal INIT_R and the second section signal IDLE_R. The internal voltage generator 253 may include a general voltage generation circuit that generates the internal voltage VINT based on the power source voltage VDD.

The second internal circuit 260 performs the boot-up operation when the boot-up signal OTP_INIT is activated. The second internal circuit 260 may include a pseudo-fuse circuit for generating correctable data instead of the OTP data, and a latch circuit for latching the data outputted from the pseudo-fuse circuit as the OTP data during the boot-up operation. The boot-up operation may include a process of reading the data from the pseudo-fuse circuit and latching it in the latch circuit. The second internal circuit 260 may further include a fuse circuit where the OTP data is programmed.

Figure 6:
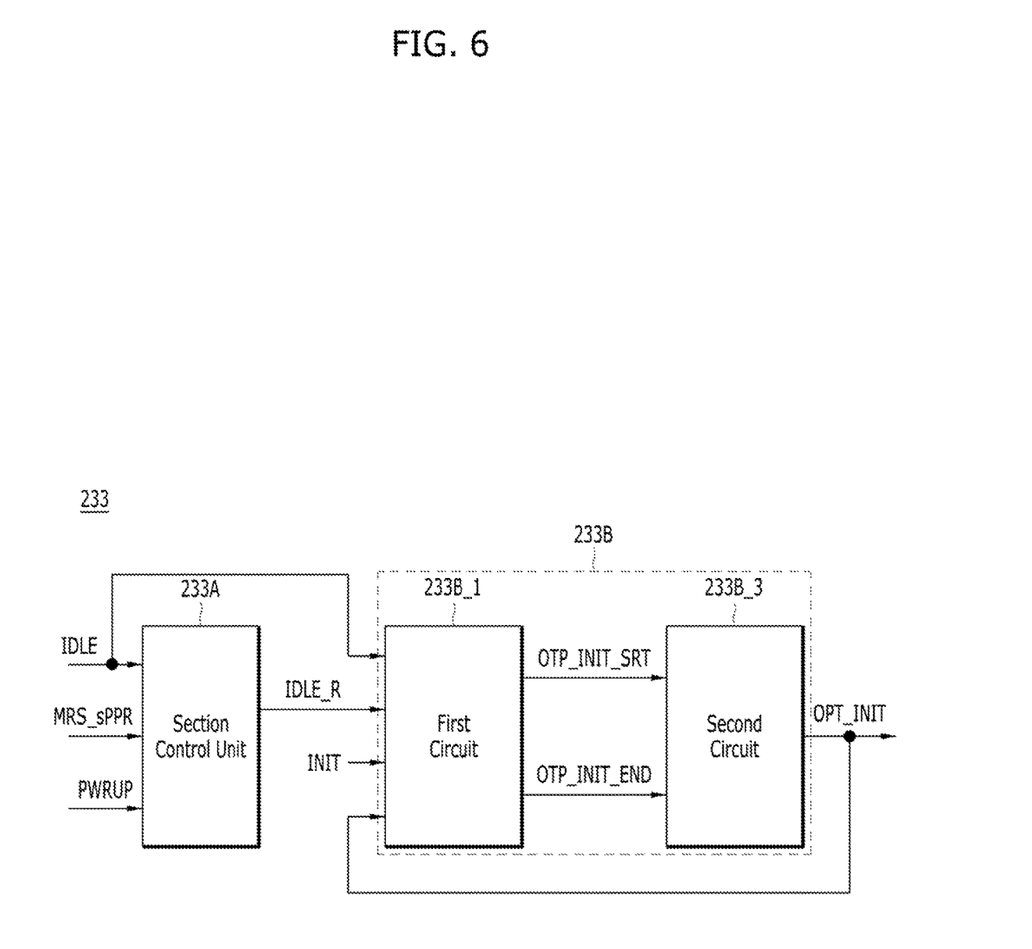
FIG. 6 is a detailed diagram of boot-up signal generator shown in FIG. 5.

FIG. 6 is a detailed diagram of the boot-up signal generator 233 shown in FIG. 5.

Referring to FIG. 6, the boot-up signal generator 233 may include a section control unit 233A and a boot-up control unit 233B. The section control unit 233A generates the second section signal IDLE_R corresponding to a portion of the normal operation section based on a first section signal IDLE corresponding to the initial operation section, the specific mode signal MRS_sPPR, and the power-up signal PWRUP. The boot-up control unit 233B activates the boot-up signal OTP_INIT based on the first section signal IDLE and the internal reset signal INIT, during the initial operation section, and activates the boot-up signal OTP_INIT based on the second section signal IDLE_R and the internal reset signal INIT during the normal operation section.

Herein, the section control unit 233A may initialize the second section signal IDLE_R based on the power-up signal PWRUP and output the first section signal IDLE as the second section signal IDLE_R based on the specific mode signal MRS_sPRR. The section control unit 233A may include a D-flip flop.

The boot-up control unit 233B may include a first circuit 233B_1 and a second circuit 233B_3. The first circuit 233B_1 generates a boot-up starting signal OTP_INIT_SRT and a boot-up ending signal OTP_INIT_END that are sequentially activated with a time gap therebetween based on the first and second boot-up signals INIT and OTP_INIT and the first and second section signals IDLE and IDLE_R. The second circuit 233B_3 generates the boot-up signal OTP_INIT based on the boot-up starting signal OTP_INIT_SRT and the boot-up ending signal OTP_INIT_END.

Figure 7A:
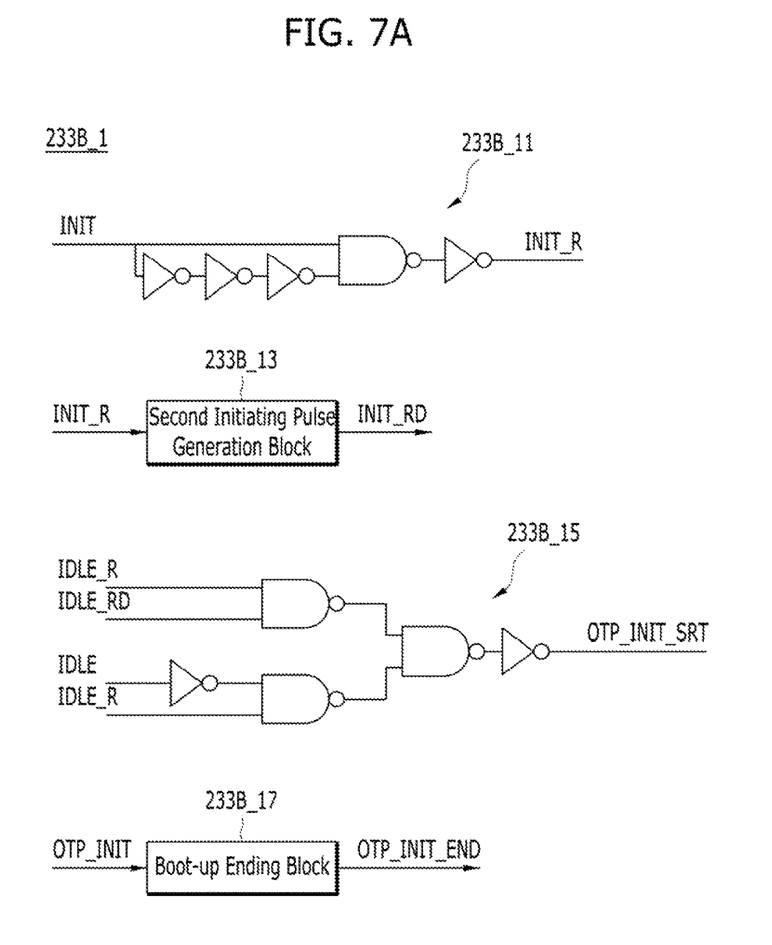
FIG. 7A is a detailed diagram of a first circuit shown in FIG. 6.
Figure 7B:
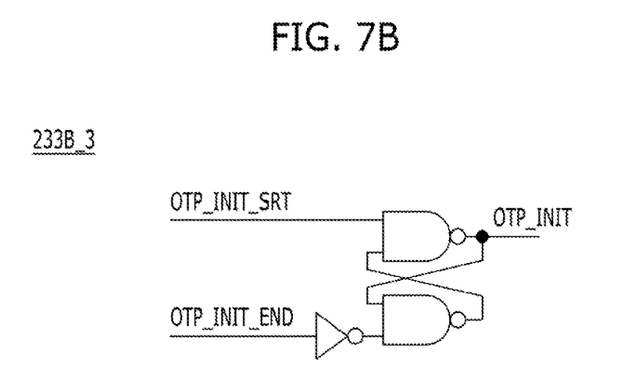
FIG. 7B is a first circuit diagram of a second circuit shown in FIG. 6.

FIG. 7A is a detailed diagram of the first circuit 233B_1 shown in FIG. 6, and FIG. 7B is a detailed diagram of the second circuit 233B_3 shown in FIG. 6.

Referring to FIG. 7A, the first circuit 233B_1 may include a first initiating pulse generation block 233B_11, a second initiating pulse generation block 233B_13, a boot-up initiating block 233B_15, and a boot-up ending block 233B_17.

The first initiating pulse generation block 233B_11 generates the first initiating pulse signal INIT_R at a moment when the internal reset signal KNIT is deactivated. The second initiating pulse generation block 233B_13 generates a second initiating pulse signal INIT_RD by delaying the first initiating pulse signal INIT_R by a predetermined time. The boot-up initiating block 233B_15 outputs the first initiating pulse signal INIT_R as the boot-up starting signal OTP_INIT_SRT based on the first section signal IDLE, and outputs the second initiating pulse signal INIT_RD as the boot-up starting signal OTP_INIT_SRT based on the second section signal IDLE_R. The boot-up ending block 233B_17 generates the boot-up ending signal OTP_INIT_END at a moment when the boot-up signal OTP_INIT is deactivated.

The first initiating pulse generation block 233B_11 may include a general pulse generation circuit, for example, a rising edge detector.

The second initiating pulse generation block 233B_13 may include a general delay circuit. The delay time for the second initiating pulse generation block 233B_13 may be determined by considering a time needed for stabilizing the internal voltage VINT.

The boot-up initiating block 233B_15 may generate the boot-up starting signal OTP_INIT_SRT by logically combining the first section signal IDLE, the second section signal IDLE_R, the first initiating pulse signal INIT_R, and the second initiating pulse signal INIT_RD. The boot-up initiating block 233B_15 may include a first inverter, a first NAND gate, a second NAND gate, a third NAND gate, and a second inverter. The first inverter inverts the first section signal IDLE. The first NAND gate performs a NAND operation on an output signal of the first inverter and the first initiating pulse signal INIT_R. The second NAND gate performs a NAND operation on the second section signal IDLE_R and the second initiating pulse signal INIT_RD. The third NAND gate performs a NAND operation on output signal's of the first and second NAND gates. The second inverter inverts an output signal of the third NAND gate to output the boot-up starting signal OTP_INIT_SRT.

The boot-up ending block 233B_17 may activate the boot-up ending signal OTP_INIT_END when the boot-up signal OTP_INIT is activated for a predetermined section. The boot-up ending block 233B_17 may include a counter circuit.

Referring to FIG. 7B, the second circuit 233B_3 may generate the boot-up signal OTP_INIT that is activated based on the boot-up starting signal OTP_INIT_SRT and deactivated based on the boot-up ending signal OTP_INIT_END. The second circuit 233B_3 may include an SR latch circuit, for example, a cross-coupled NAND latch.

Figure 8:
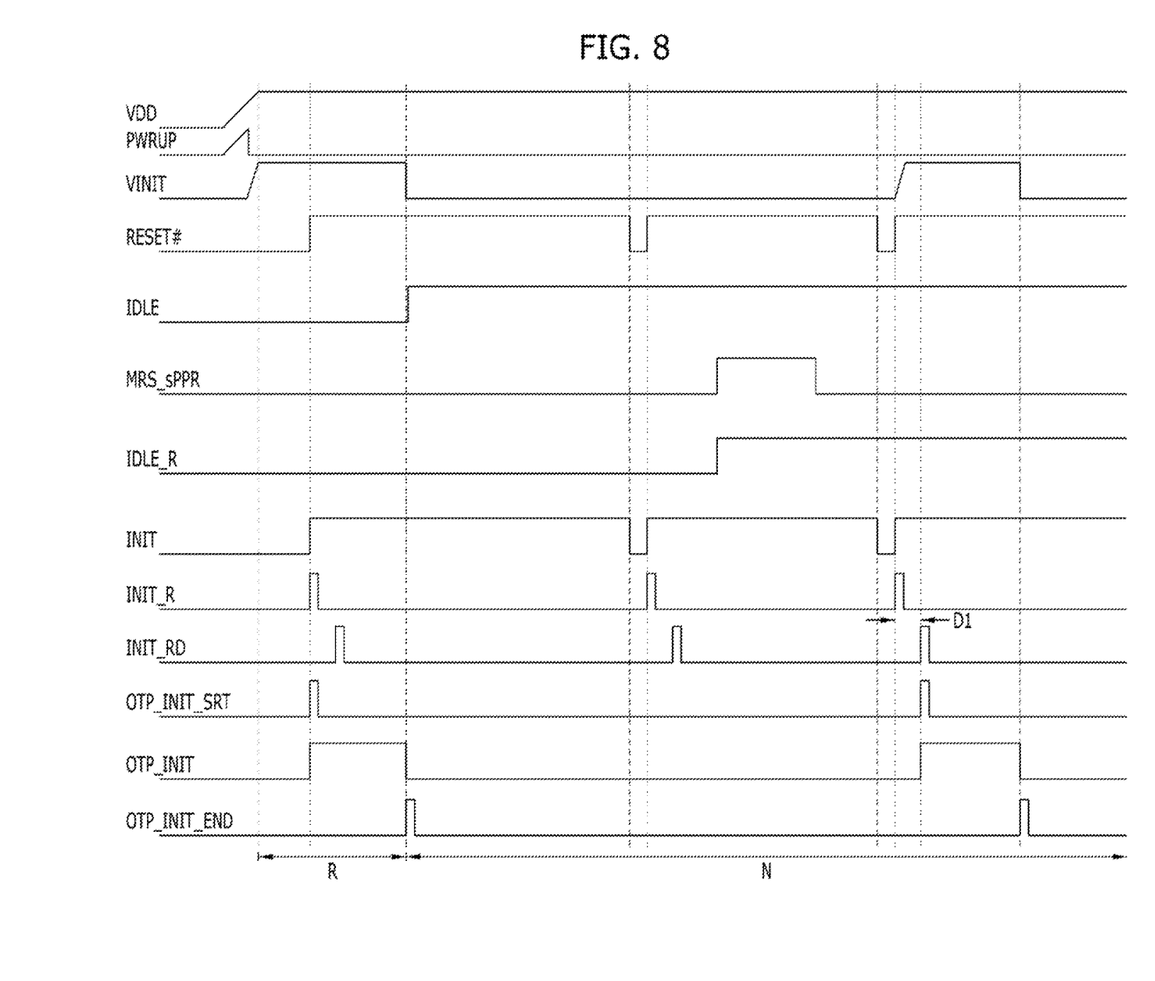
FIG. 8 is a timing diagram for describing an operation of a semiconductor system shown in FIG. 4.

FIG. 8 is a timing diagram for describing an operation of a semiconductor system shown in FIG. 4.

Referring to FIGS. 4 to 8, the controller 100 may supply a power source voltage to the semiconductor device 200. The controller 100 activates the reset control signal RESET# to a logic low level from a moment when it supplies the power source voltage VDD to a portion of the initial operation section R. Particularly, the controller 100 may activate the reset control signal RESET# to a logic low level of over approximately 200 μs in the initial operation section R, and then deactivate the reset control signal RESET# to a logic high level.

The semiconductor device 200 then may perform the reset operation and the boot-up operation during the initial operation section R while the internal voltage VINT is stabilized based on the power source voltage VDD and the reset control signal RESET#. reset operation First, when the internal reset signal generator 231 activates the internal reset signal INIT based on the reset control signal RESET#, the first internal circuit 240 may perform the reset operation in the initial operation section R based on the internal reset signal INIT. If the first internal circuit 240 is a counter circuit, the reset operation may include a process of initializing a count value of the counter circuit to a predetermined default value.

Subsequently, the boot-up signal generator 233 may generate the boot-up signal OTP_INIT based on the power-up signal PWRUP and the internal reset signal INIT. To be specific, the first circuit 233B_1 may generate the boot-up starting signal OTP_INIT_SRT that is activated when the internal reset signal INIT is deactivated, and generate the boot-up ending signal OTP_INIT_END that is activated after a predetermined counting operation time. The second circuit 233B_3 may generate the boot-up signal OTP_INIT that is activated based on the boot-up starting signal OTP_INIT_SRT and deactivated based on the boot-up ending signal OTP_INIT_END.

The second internal circuit 260 then performs the boot-up operation in the initial operation section R based on the boot-up signal OTP_INIT. If the second internal circuit 260 is an OTP circuit, the boot-up operation may include a process of reading the OTP data from the fuse circuit of the OTP circuit and latching the read OTP data in the latch circuit.

Subsequently, the controller 100 may activate the reset control signal RESET# to a logic low level, whenever the reset control signal RESET# needs to be activated, to perform the reset operation in the normal operation section N. The controller 100 may activate the mode related signals to perform the boot-up operation in the normal operation section N.

The semiconductor device 200 may perform the reset operation and the boot-up operation based on the mode related signals and the reset control signal RESET# in the normal operation section N. Herein, since the reset operation performed in the normal operation section N is the same as the process performed in the initial operation section R, a detailed description on it is omitted. Hereafter, the boot-up operation performed in the normal operation section N is described in detail.

When the mode related signals are activated, the mode signal generator 220 may generate a specific mode signal MRS_sPPR. A specific mode signal MRS_sPPR is a mode signal that is activated to correspond to a specific mode. For example, the specific mode signal MRS_sPPR may include a mode signal that is activated in an sPPR mode.

A post package repair (PPR) mode may include an operation of substantially programming the OTP data, including repair data, in the fuse circuit. The sPPR mode may include an operation of correcting and changing the OTP data that is latched in the latch circuit by generating virtual OTP data as if the OTP data is programmed in the fuse circuit. However, in actuality, the OTP data is not programmed in the fuse circuit in the sPPR mode.

Subsequently, the section control unit 233A may activate the second section signal IDLE_R as the specific mode signal MRS_sPPR is activated. The first circuit 233B_1 then may generate the boot-up starting signal OTP_INIT_SRT that is activated at a moment delayed by a predetermined delay time D1 from a moment when the internal reset signal INIT is deactivated. The first circuit 233B_1 may generate the boot-up ending signal OTP_INIT_END that is activated after a predetermined counting time passes from a moment when the boot-up starting signal OTP_INIT_SRT is activated. As a result, the second circuit 233B_3 may generate the boot-up signal OTP_INIT that is activated based on the boot-up starting signal OTP_INIT_SRT and deactivated based on the boot-up ending signal OTP_INIT_END.

The second internal circuit 260 may perform the boot-up operation in the normal operation section N based on the boot-up signal OTP_INIT. If the second internal circuit 260 is an OTP circuit the boot-up operation may include a process of reading the virtual OTP data from the pseudo-fuse circuit included in the OTP circuit and latching the read virtual OTP data in the latch circuit.

Meanwhile, the first internal circuit 240 may perform the reset operation in the normal operation section N based on the internal reset signal INIT. The internal voltage generation circuit 250 may generate the internal voltage VINT before the boot-up signal OTP_INIT is activated, based on the internal reset signal INIT. Therefore, the second internal circuit 260 may use the internal voltage VINT that is already stabilized when the second internal circuit 260 performs the boot-up operation.

According to the first embodiment of the present invention, since the reset operation including the boot-up operation may be performed regardless of the kind of the operation section, it may be possible to correct and change the OTP data not only in the initial operation section but also the normal operation section and to perform the reset operation while the internal voltage is stabilized, which are advantageous.

Figure 9:
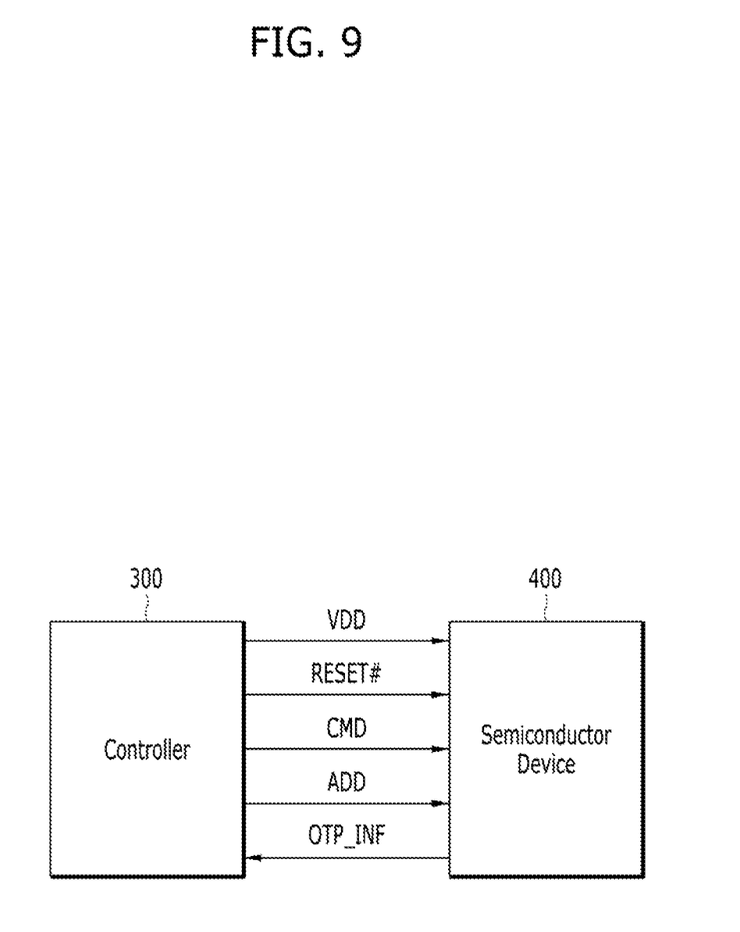
FIG. 9 is a block diagram illustrating a semiconductor system in accordance with an embodiment of the present invention.

FIG. 9 is a block diagram illustrating a semiconductor system in accordance with an embodiment of the present invention.

Referring to FIG. 9, the semiconductor system may include a controller 300 and a semiconductor device 400. The controller 300 generates a power source voltage VDD, a reset control signal RESET, mode related signals, and monitors a specific information signal OTP_INF. The semiconductor device 400 performs a reset operation and a boot-up operation based on the power source voltage VDD, the reset control signal RESET#, and the mode related signal's, and provides the controller 300 with the specific information signal OTP_INF that corresponds to at least one between the reset operation and the boot-up operation.

The controller 300 may be the same as the controller 100 shown in FIG. 4 except that the controller 300 may monitor the specific information signal OTP_INF transmitted from the semiconductor device 400.

The semiconductor device 400 may be the same as the semiconductor device 200 shown in FIG. 4. If there is any difference, the semiconductor device 400 may provide the controller 300 with the specific information signal OTP_INF that corresponds to the boot-up operation.

Figure 10:
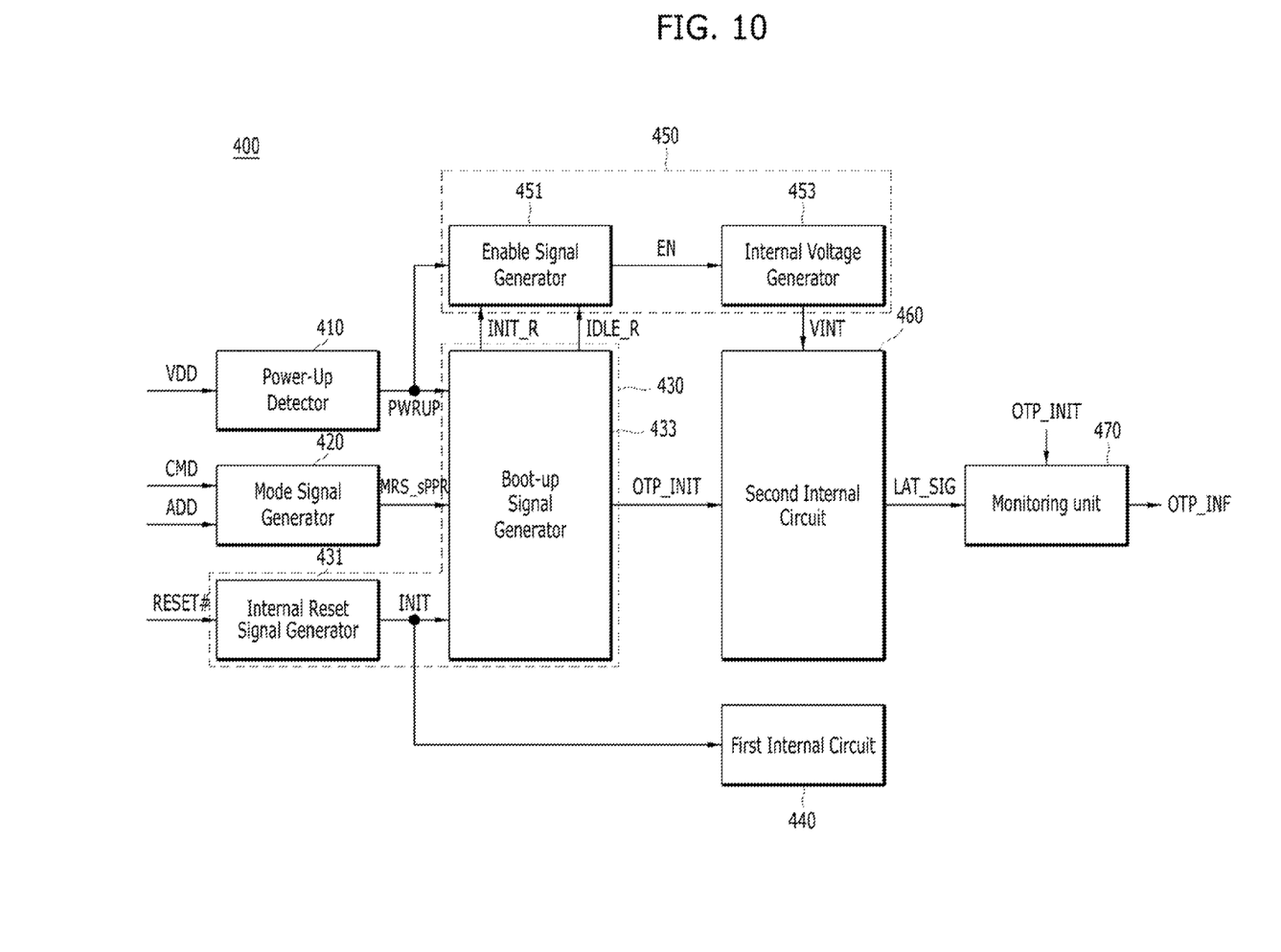
FIG. 10 is a detailed diagram of a semiconductor device shown in FIG. 9.

FIG. 10 is a detailed diagram of the semiconductor device 400 shown in FIG. 9.

Referring to FIG. 10, the semiconductor device 400 may include a power-up detector 410, a mode signal generator 420, a reset control circuit 430, a first internal circuit 440, an internal voltage generation circuit 450, a second internal circuit 460, and a monitoring circuit 470.

The reset control circuit 430 may include an internal reset signal generator 431 and a boot-up signal generator 433. In addition, the internal voltage generation circuit 450 may include an enable signal generator 451 and an internal voltage generator 453.

Since the power-up detector 410, the mode signal generator 420, the reset control circuit 430, the first internal circuit 440, the internal voltage generation circuit 450, and the second internal circuit 460 are the same as 210, 220, 230, 240, 250 and 260 of FIG. 5, a detailed description on them is omitted herein.

The monitoring circuit 470 may output a reset result signal LAT_SIG outputted from the second internal circuit 460 as the specific information signal OTP_INF based on the boot-up signal OTP_INIT. The reset, result signal LAT_SIG may be a signal corresponding to an operation result of the boot-up operation. The boot-up operation may include a process of reading an OTP data signal from a pseudo-fuse circuit and latching the read OTP data in a latch circuit. Herein the reset result signal LAT_SIG may include the signal latched in the latch circuit.

Hereafter, an operation of the semiconductor system having the above-described structure is described with reference to FIG. 11.

Figure 11:
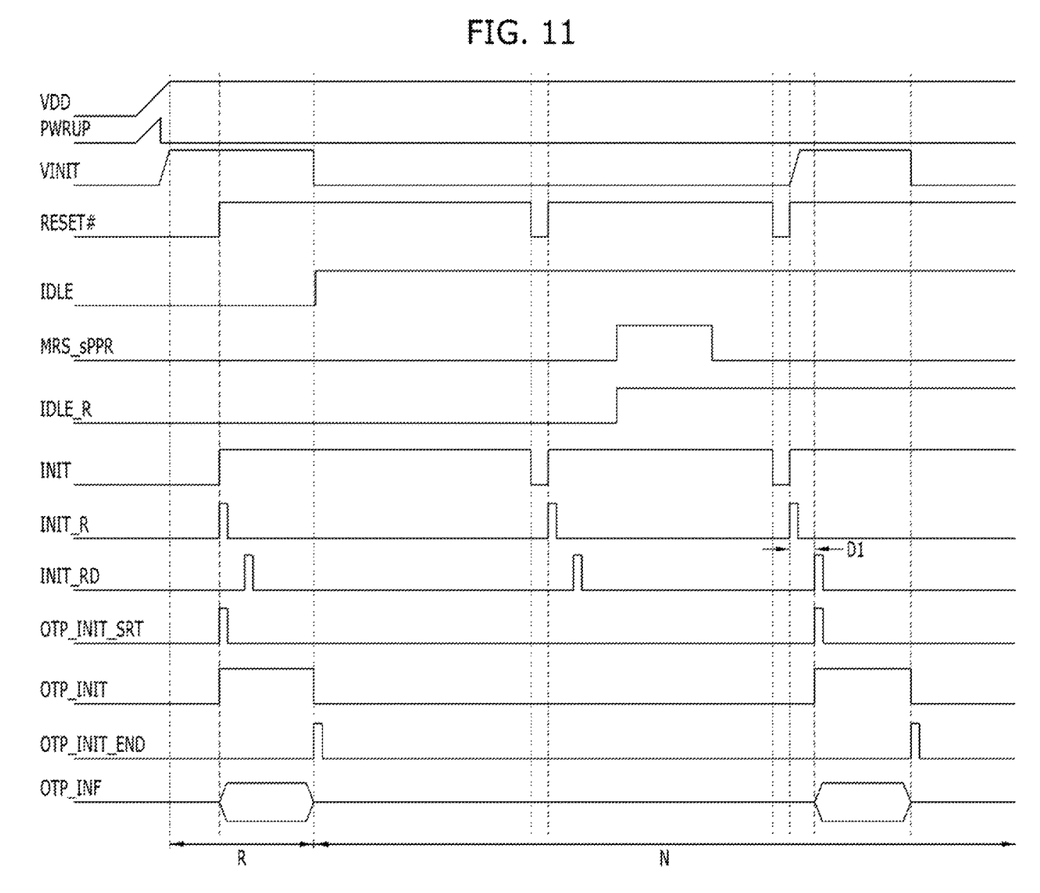
FIG. 11 is a timing diagram for describing an operation of a semiconductor system shown in FIG. 9.

FIG. 11 is a timing diagram for describing an operation of the semiconductor system shown in FIG. 9.

Referring to FIGS. 9 to 11, the operation of the semiconductor system may be the same as the operation of the semiconductor system shown in FIGS. 4 to 8, except that the monitoring circuit 470 may provide the controller 300 with the specific information signal OTP_INF corresponding to the operation result of the boot-up operation in the semiconductor system when the second internal circuit 460 performs the boot-up operation based on the boot-up signal OTP_INIT.

According to the embodiments of the present invention, since the reset operation including a boot-up operation may be performed regardless of an operation section, it may be possible to correct and change the OTP data in the initial operation section and the normal operation section to perform the reset operation while the internal voltage is stabilized, and to easily control and manage the semiconductor device by monitoring the operation result of the reset operation.

According to the embodiments of the present invention, a semiconductor device may perform a reset operation of an OTP circuit regardless of an operation section. Also, the semiconductor device may perform the reset operation of the OTP circuit while an internal voltage used for the OTP circuit is stabilized, and provide a controller with a reset operation result of the OTP circuit. Therefore, the performance of the semiconductor device and the performance of a semiconductor system including the semiconductor device may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a boot-up signal generator suitable for generating a boot-up signal based on at least one of an external reset signal and a specific mode signal for each operation section; and
an internal circuit suitable for performing a boot-up operation based on the boot-up signal, and
wherein the boot-up signal generator generates the boot-up signal based on the external reset signal during a first operation section, and
generates the boot-up signal based on the external reset signal and the specific mode signal during a second operation section, exclusive of the first operation section.

2. The semiconductor device of claim 1, wherein the first operation section includes an initial operation section corresponding to a power-up section, and
the second operation section includes a normal operation section subsequent to the initial operation section.

3. The semiconductor device of claim 1, wherein the specific mode signal includes a signal corresponding to a soft post package repair (sPPR) mode.

4. The semiconductor device of claim 3, wherein the internal circuit includes a one-time programmable (OTP) circuit, and
the boot-up operation in the sPPR mode includes an operation of reading and latching data for replacing one-time programmable (OTP) data that is programmed in the OTP circuit.

5. A semiconductor device, comprising:
a power-up detector suitable for detecting a power-up section of an external power source voltage to generate a power-up signal;
a mode signal generator suitable for generating a specific mode signal based on an external mode related signal;
an internal reset signal generator suitable for generating an internal reset signal based on an external reset signal;
a boot-up signal generator suitable for generating a boot-up signal based on at least one of the internal reset signal and the specific mode signal; and
an internal circuit suitable for performing a boot-up operation based on the boot-up signal,
wherein the boot-up signal generator generates the boot-up signal based on the internal reset signal during an initial operation section, and
generates the boot-up signal based on the internal reset signal and the specific mode signal during a normal operation section that is subsequent to the initial operation section.

6. The semiconductor device of claim 5, wherein the boot-up signal generator includes:
a section control unit suitable for generating a first section signal corresponding to the initial operation section, and generating a second section signal activated in the normal operation section based on the specific mode signal; and a boot-up control unit suitable for activating the boot-up signal based on the first section signal and the internal reset signal during the initial operation section, and activating the boot-up signal based on the internal reset signal, the second section signal, and the specific mode signal, during the normal operation section.

7. The semiconductor device of claim 5, wherein the boot-up control unit includes:
a first circuit suitable for generating a boot-up starting signal and a boot-up ending signal that are sequentially activated with a predetermined time gap therebetween based on the first and boot-up signals and the first and second section signals; and
a second circuit suitable for generating the boot-up signal that is activated based on the boot-up starting signal and deactivated based on the boot-up ending signal.

8. The semiconductor device of claim 7, wherein the first circuit includes:
a first initiating pulse generation block suitable for generating a first initiating pulse signal at a moment when the internal reset signal is deactivated;
a second initiating pulse generation block suitable for generating a second initiating pulse signal by delaying the first initiating pulse signal by a predetermined time;
a boot-up initiating block suitable for outputting the first initiating pulse signal as the boot-up starting signal based on the first section signal and outputting the second initiating pulse signal as the boot-up starting signal based on the second section signal; and
a boot-up ending block suitable for generating the boot-up ending signal at a moment when the boot-up signal is deactivated.

9. The semiconductor device of claim 8, wherein the boot-up control unit activates the boot-up signal after an internal voltage that is used for the reset operation is stabilized.

10. The semiconductor device of claim 9, further comprising:
an internal voltage generation circuit that is activated ahead of a moment when the boot-up signal is activated based on the power-up signal, the first initiating pulse signal, and the second section signal, and deactivated based on the boot-up ending signal.

11. The semiconductor device of claim 8, wherein the second circuit includes an SR latch circuit.

12. The semiconductor device of claim 5, wherein the mode signal generator includes a mode register set (MRS).

13. The semiconductor device of claim 5, wherein the specific mode signal corresponding to an sPPR mode.

14. The semiconductor device of claim 13, wherein the internal circuit includes a one-time programmable (OTP) circuit, and
the boot-up operation in the sPPR mode includes an operation of reading and latching data for replacing OTP data that is programmed in the OTP circuit.

15. A semiconductor system, comprising:
a semiconductor device suitable for performing a boot-up operation based on a reset control signal during an initial operation section corresponding to a power-up section of a power source voltage, and performing the boot-up operation based on a mode related signal during a normal operation section that is subsequent to the initial operation section; and
a controller suitable for providing the semiconductor device with the power source voltage, the reset control signal and the mode related signal,
wherein the semiconductor device generates a specific information signal corresponding to the boot-up operation, and
the controller monitors the specific information signal.

16. The semiconductor system of claim 15, wherein the mode related signal includes a signal corresponding to an sPPR mode.

17. The semiconductor system of claim 15, wherein the semiconductor device comprises:
a power-up detector suitable for detecting a power-up section of the power source voltage to generate a power-up signal;
a mode signal generator suitable for generating a specific mode signal based on the mode related signal;
an internal reset signal generator suitable for generating an internal reset signal based on an external reset signal;
a boot-up signal generator suitable for generating a boot-up signal based on the internal reset signal and the specific mode signal;
an internal circuit suitable for reading predetermined fuse data and latching the read fuse data based on the boot-up signal; and
a monitoring circuit suitable for transmitting the fuse data that is latched in the internal circuit as the specific information signal to the controller based on the boot-up signal.

* * * * *